US012660689B2

(12) United States Patent
Bansal

(10) Patent No.: US 12,660,689 B2
(45) Date of Patent: Jun. 16, 2026

(54) SEMICONDUCTOR DEVICES, ASSEMBLIES, AND ASSOCIATED METHODS

(71) Applicant: Micron Technology, Inc., Boise, ID (US)

(72) Inventor: Raj K. Bansal, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 749 days.

(21) Appl. No.: 17/893,941

(22) Filed: Aug. 23, 2022

(65) Prior Publication Data

US 2024/0072002 A1     Feb. 29, 2024

(51) Int. Cl.
| | |
|---|---|
| *H10W 90/00* | (2026.01) |
| *H10W 70/65* | (2026.01) |
| *H10W 70/652* | (2026.01) |
| *H10W 72/90* | (2026.01) |
| *H10W 90/24* | (2026.01) |

(52) U.S. Cl.
CPC ............ *H10W 90/00* (2026.01); *H10W 70/65* (2026.01); *H10W 70/652* (2026.01); *H10W 72/922* (2026.01); *H10W 90/24* (2026.01); *H10W 90/751* (2026.01); *H10W 90/752* (2026.01); *H10W 90/754* (2026.01)

(58) Field of Classification Search
CPC ..... H01L 25/0657; H01L 24/05; H01L 24/48; H01L 25/50; H10W 90/00; H10W 70/65; H10W 70/652; H10W 72/922
See application file for complete search history.

(56) References Cited

U.S. PATENT DOCUMENTS

| | | | | |
|---|---|---|---|---|
| 6,476,506 B1 * | 11/2002 | O'Connor | ............. | H10W 70/65 |
| | | | | 257/773 |
| 7,129,584 B2 * | 10/2006 | Lee | ..................... | H01L 25/0657 |
| | | | | 257/734 |
| 7,535,110 B2 * | 5/2009 | Wu | ..................... | H01L 25/0657 |
| | | | | 257/777 |
| 8,026,587 B1 * | 9/2011 | Hiner | ..................... | H05K 3/107 |
| | | | | 257/773 |
| 8,125,065 B2 * | 2/2012 | Lee | ..................... | H01L 25/0657 |
| | | | | 257/737 |

(Continued)

FOREIGN PATENT DOCUMENTS

| | | | | | |
|---|---|---|---|---|---|
| CN | 103208486 A | * | 7/2013 | ............. | H01L 24/24 |
| CN | 104979220 B | * | 9/2017 | | |

(Continued)

*Primary Examiner* — Laura M Menz
(74) *Attorney, Agent, or Firm* — Dorsey & Whitney LLP

(57) ABSTRACT

A semiconductor device assembly can include an assembly substrate having a top surface with a die stack thereat. The die stack can include a first and a second die, and each dies can include a die substrate with a top and a bottom surface. The top surface can include a first region a first distance from the bottom surface, and a second region a second distance, greater than the first distance, from the bottom surface and with a bond pad thereat. The bottom surface of the first die can bond with the top surface of the assembly substrate, and the bottom surface of the second die can bond with the first region of the first die top surface. In some embodiments, the assembly can further include additional die stacks and/or additional dies within one or more die stacks.

16 Claims, 4 Drawing Sheets

Detail A

(56) References Cited

U.S. PATENT DOCUMENTS

| | | | | |
|---|---|---|---|---|
| 8,294,251 B2 * | 10/2012 | Takiar | H01L 25/0657 | |
| | | | | 257/777 |
| 8,441,113 B2 * | 5/2013 | Lee | H01L 25/0657 | |
| | | | | 257/737 |
| 8,963,312 B2 * | 2/2015 | Ho | G06V 40/1329 | |
| | | | | 257/784 |
| 9,230,942 B2 * | 1/2016 | Kumar | H10W 90/00 | |
| 9,293,443 B2 * | 3/2016 | Nam | H01L 25/0657 | |
| 9,377,486 B2 * | 6/2016 | Song | G01R 31/2874 | |
| 9,633,935 B2 * | 4/2017 | Ho | H10W 90/701 | |
| 10,483,239 B2 * | 11/2019 | Yan | H10W 42/00 | |
| 10,651,100 B2 * | 5/2020 | Sugioka | H10P 74/273 | |
| 10,847,482 B2 * | 11/2020 | Sugioka | G03F 1/54 | |
| 10,943,841 B2 * | 3/2021 | Sugioka | H10P 74/273 | |
| 11,211,347 B2 * | 12/2021 | Sugioka | G03F 1/54 | |
| 11,600,523 B2 * | 3/2023 | Lam | H10P 74/207 | |
| 2008/0074852 A1 * | 3/2008 | Lee | H01L 25/0657 | |
| | | | | 257/E23.141 |
| 2009/0286356 A1 * | 11/2009 | Mess | H10W 74/117 | |
| | | | | 438/109 |
| 2009/0321950 A1 * | 12/2009 | Takiar | H01L 25/0657 | |
| | | | | 257/E23.024 |
| 2010/0078793 A1 * | 4/2010 | Mess | H10W 74/117 | |
| | | | | 438/109 |
| 2010/0148331 A1 * | 6/2010 | Mess | H10W 74/117 | |
| | | | | 257/676 |
| 2010/0230795 A1 * | 9/2010 | Kriman | H10W 90/00 | |
| | | | | 438/109 |
| 2012/0153468 A1 * | 6/2012 | Lee | H01L 25/0657 | |
| | | | | 257/737 |
| 2014/0232001 A1 * | 8/2014 | Gratz | H10W 42/121 | |
| | | | | 438/622 |
| 2014/0332908 A1 * | 11/2014 | Ho | H10W 20/081 | |
| | | | | 438/48 |
| 2014/0332968 A1 * | 11/2014 | Ho | H10W 70/657 | |
| | | | | 257/773 |
| 2014/0332983 A1 * | 11/2014 | Ho | G06V 40/1329 | |
| | | | | 438/126 |
| 2015/0194410 A1 * | 7/2015 | Nam | H01L 25/0657 | |
| | | | | 257/701 |
| 2015/0276798 A1 * | 10/2015 | Song | G01R 1/04 | |
| | | | | 324/750.08 |
| 2018/0190621 A1 * | 7/2018 | Yan | H10W 42/00 | |
| 2019/0043840 A1 * | 2/2019 | Watanabe | H10W 74/129 | |
| 2019/0267416 A1 * | 8/2019 | Kohama | H04N 25/78 | |
| 2019/0355631 A1 * | 11/2019 | Sugioka | H10P 74/273 | |
| 2019/0355682 A1 * | 11/2019 | Sugioka | G03F 1/54 | |
| 2020/0227327 A1 * | 7/2020 | Sugioka | H10P 74/273 | |
| 2021/0020592 A1 * | 1/2021 | Sugioka | G03F 1/54 | |
| 2021/0183843 A1 * | 6/2021 | Arifeen | H10W 90/00 | |
| 2024/0072002 A1 * | 2/2024 | Bansal | H01L 24/46 | |
| 2024/0128143 A1 * | 4/2024 | Hsieh | H10P 54/00 | |
| 2024/0282680 A1 * | 8/2024 | Dimaano, Jr. | H10W 70/411 | |
| 2024/0312890 A1 * | 9/2024 | Boo | H10W 70/65 | |
| 2024/0355772 A1 * | 10/2024 | Azizan | H10W 90/00 | |
| 2025/0210581 A1 * | 6/2025 | Bhushan | H10W 72/50 | |
| 2025/0236509 A1 * | 7/2025 | Sun | G02B 27/0172 | |
| 2025/0309216 A1 * | 10/2025 | Bhushan | H10B 12/01 | |

FOREIGN PATENT DOCUMENTS

| | | | | | |
|---|---|---|---|---|---|
| CN | 113764383 A | * | 12/2021 | | H01L 21/563 |
| CN | 118434159 A | * | 8/2024 | | H01L 21/56 |
| CN | 118507455 A | * | 8/2024 | | H01L 23/49575 |
| CN | 118678702 A | * | 9/2024 | | H01L 23/3128 |
| DE | 10251527 A1 | * | 5/2004 | | H10W 90/00 |
| DE | 102005039786 A1 | * | 3/2007 | | H01L 25/0657 |
| DE | 102024100449 A1 | * | 11/2024 | | H01L 24/48 |
| JP | 2007035906 A | * | 2/2007 | | |
| JP | 2010165984 A | * | 7/2010 | | H01L 24/91 |
| JP | 6892252 B2 | * | 6/2021 | | |
| KR | 20150081646 A | * | 7/2015 | | H01L 24/32 |
| SG | 121702 A1 | * | 5/2006 | | |
| SG | 152909 A1 | * | 6/2009 | | |
| SG | 164491 A1 | * | 9/2010 | | |
| SG | 165445 A1 | * | 10/2010 | | |
| SG | 167661 A1 | * | 1/2011 | | |
| SG | 170615 A1 | * | 5/2011 | | |
| SG | 190487 A1 | * | 6/2013 | | H01L 24/97 |
| TW | 200807670 A | * | 2/2008 | | H01L 25/50 |
| TW | 1447869 B | * | 8/2014 | | |
| TW | 201434132 A | * | 9/2014 | | H01L 25/50 |
| TW | 201528555 A | * | 7/2015 | | H01L 24/32 |
| WO | WO-03005782 A2 | * | 1/2003 | | H01L 25/105 |
| WO | WO-2009145727 A1 | * | 12/2009 | | H01L 24/19 |
| WO | WO-2024053466 A1 | * | 3/2024 | | H10F 39/12 |
| WO | WO-2025212380 A1 | * | 10/2025 | | H10B 80/00 |

* cited by examiner

Detail A

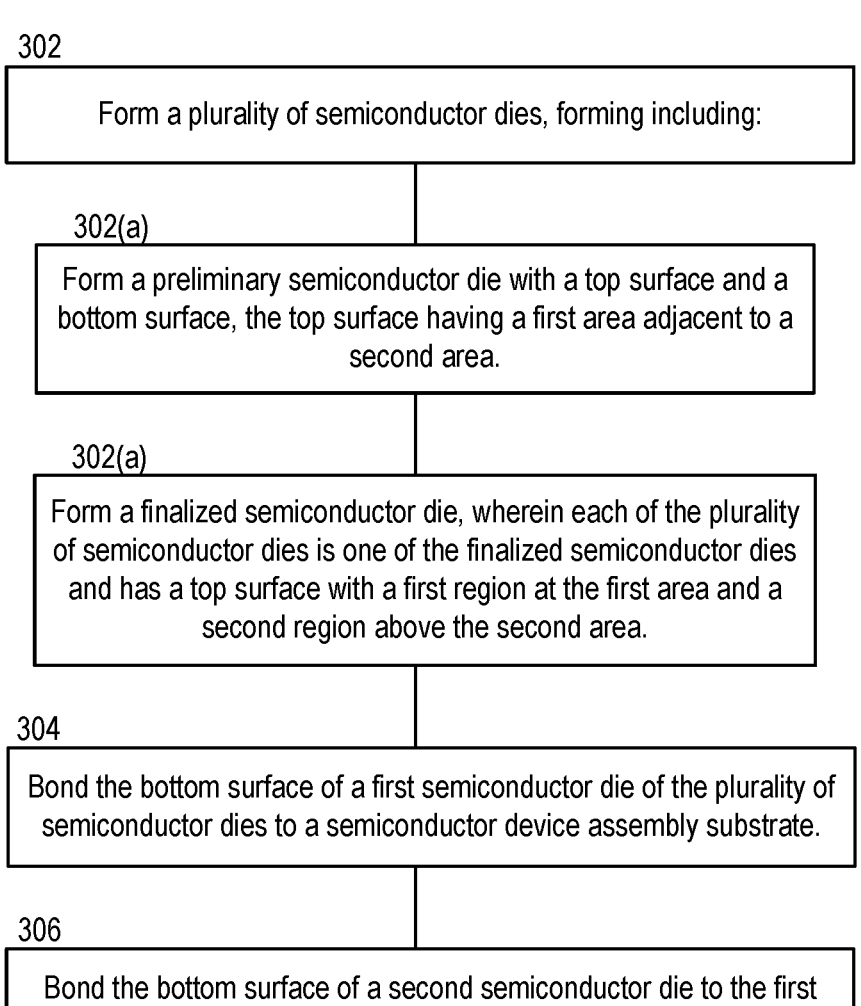

300

302

Form a plurality of semiconductor dies, forming including:

302(a)

Form a preliminary semiconductor die with a top surface and a bottom surface, the top surface having a first area adjacent to a second area.

302(a)

Form a finalized semiconductor die, wherein each of the plurality of semiconductor dies is one of the finalized semiconductor dies and has a top surface with a first region at the first area and a second region above the second area.

304

Bond the bottom surface of a first semiconductor die of the plurality of semiconductor dies to a semiconductor device assembly substrate.

306

Bond the bottom surface of a second semiconductor die to the first area of the top surface of the first semiconductor die.

SEMICONDUCTOR DEVICES, ASSEMBLIES, AND ASSOCIATED METHODS

TECHNICAL FIELD

The present technology is generally related to semiconductor devices. In particular, the present technology relates to semiconductor devices including a raised portion on a top surface thereof.

BACKGROUND

Microelectronic devices, such as memory devices and microprocessors, and other electronics, typically include one or more semiconductor devices and/or components attached to one or more of a substrate, another semiconductor device, and/or encased in a protective covering. The devices and/or components include at least one functional feature, such as memory cells, processor circuits, and/or interconnecting circuitry, etc. Each device and/or component commonly includes an array of small bond pads electrically coupled to the functional features therein for interconnection with other devices and/or components. Manufacturers are under increasing pressure to reduce the space occupied by these devices and components while simultaneously increasing the capacity and/or speed of operation for the resulting semiconductor assemblies.

One method manufacturers use to reduce space and increase capacity is stacking semiconductor devices (e.g., dies) within semiconductor assembly packages. Manufacturers can sequentially stack semiconductor dies over an assembly package substrate, shingling the dies to expose bond pads on an edge thereof. These bond pads allow for inter-die connections, as well as die-substrate connections. However, as the number of components increase within each individual die to increase die and assembly package operating capacity, die height increases. As die height increases, the corresponding change in package height increases as a multiple of the number of dies therein. Therefore renewed opportunity for space reduction and operating capacity expansion remains at both the die and assembly levels.

BRIEF DESCRIPTION OF THE DRAWINGS

FIG. 3 is a flow diagram illustrating a process for producing a semiconductor device, in accordance with some embodiments of the present technology.

Figure 1:
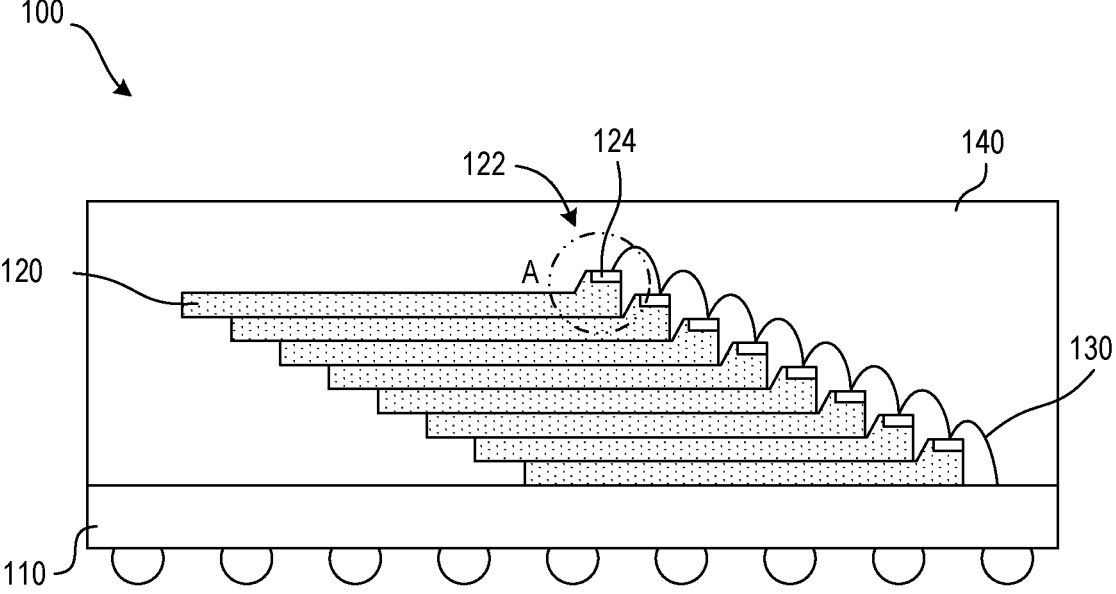
FIG. 1 is a side view of a semiconductor device assembly, configured in accordance with some embodiments of the present technology.

The drawings have not necessarily been drawn to scale. Similarly, some components or operations can be separated into different components or combined into a single assembly in some implementations of the present technology. While the technology is amenable to various modifications and alternative forms, specific implementations have been shown by way of example in the drawings and are described in detail below.

DETAILED DESCRIPTION

Traditional semiconductor device redistribution layers ("RDL") with external bond pads extend across the top and/or bottom surface of a semiconductor device. These layers require certain structural and operational considerations for protecting functional features (e.g., components) within the semiconductor device from the bond pads. For example, bond pads can experience high temperatures and/or forces exerted thereon. Bond pads can experience high temperatures during manufacture (e.g., formation and/or assembly), and can experience high forces during interconnection with wires and/or other devices. To protect components within the semiconductor device from the bond pads, RDLs include excess substrate material (e.g., spacer material, buffer portion, non-functional material) between the bond pads and the components thereunder to dissipate experienced heat and/or forces from the bond pad. This excess substrate material increases device and assembly heights, as well as manufacturing and material costs, both without increased operating capacity.

The devices, assemblies, and methods of the present technology relate to semiconductor devices including raised portions (e.g., RDL, "pad islands") on one or more side edges of the devices (e.g., extending from a top surface at a side edge), and excluding raised portions at a center top surface of the devices. When the raised portion and the bond pads thereon are limited to a side edge of a device, the buffer portion required by the bond pads can similarly be limited to the edge of the device. Further, areas of the top surface of the device excluding the raised portion can similarly exclude the buffer portion, reducing the device height thereat without reducing overall operating capacity. Therefore, aspects of the present technology provide many benefits over at least the traditional semiconductor devices described above. For example, individual devices must only include the buffer portion along the edge thereof, reducing warpage and/or bond pad concerns. Further, excluding the buffer portion elsewhere on the device can reduce material and manufacturing requirements, improving production times and/or reducing costs. Regarding device assemblies, assembly heights can similarly be reduced by stacking and shingling devices so that no raised portions vertically overlap. That is, the height of a device stack can be only a sum of device heights excluding the buffer portion. Therefore more operating capacity can be included in a smaller assembly package, improving end product performance and/or reducing end product size.

Some embodiments of the present technology, such as a semiconductor device assembly can include an assembly substrate having a top surface with a semiconductor die (e.g., device) stack thereat. The die stack can include a first and a second die, and each of the first and second dies can include a die substrate with a top and bottom surface. The top surface can include a first region at a first distance from the bottom surface. Further, the top surface can include a second region at a second distance, greater than the first distance, from the bottom surface and with a bond pad thereat. The bottom surface of the first die can be bonded to the top surface of the assembly substrate, and the bottom surface of the second die can be bonded to the first region of the top surface of the first die. In some embodiments, the assembly can further include additional die stacks and/or additional dies within one or more die stacks. Similarly, a sole semiconductor die can include a die substrate having a bottom surface and a top surface. A first region of the top surface can be a first distance from the bottom surface, and a second region of the top surface can be a second distance from the bottom surface, greater than the first distance. The semiconductor die can further include a bond pad at the second region of the top surface.

The semiconductor die, and one or more semiconductor dies of the semiconductor device assembly, can be manufactured by forming a preliminary semiconductor die with a flat top surface and a bottom surface. The top surface can include a first area adjacent to a second area. The semiconductor die can be finalized by forming an RDL over and extending from the second area of the primary semiconductor die, excluding any portions of the RDL on the first area. The top surface of the finalized semiconductor die can then include the first region at the first area of the preliminary semiconductor die, and a second region above the second area of the preliminary semiconductor die.

For ease of reference, semiconductor devices and/or assemblies and other components are sometimes described herein with reference to top, bottom, left, right, lateral, vertical, uppermost, lowermost, or other similar directional terms relative to the spatial orientation of the embodiments described and/or shown in the figures. The semiconductor devices described herein and modifications thereof can be moved to and/or used in different spatial orientations without changing the structure and/or function of the disclosed embodiments of the present technology.

FIG. 1 is a side view of a semiconductor device assembly 100 with semiconductor devices 120, each having a raised portion 122, configured in accordance with embodiments of the present technology. The assembly 100 can include one or more devices 120 (e.g., semiconductor dies, dies) stacked and shingled over (e.g., coupled to) an assembly substrate 110 and encased in a mold material 140. Each device 120 can be a memory and/or a processing device, such as a memory die (e.g., a NAND die, a DRAM die, a NOR die, a PCM die, a FeRAM die, etc.), a graphics processing unit, a logic device, or any similar semiconductor device. One or more of the devices 120 can include the raised portion 122 (e.g., raised relative to a remainder of the device 120) extending from a top surface of the device 120 along an edge (e.g., a right edge, as illustrated) at a periphery of the device 120. Further, one or more of the devices 120 can include a bond pad 124 (i) at the respective raised portion 122 and (ii) in electric communication with components (e.g., functional features, active components) within the respective device 120. A wire segment 130 can be coupled to the substrate 110 and to one or more of the bond pads 124. The wire segment 130 can electrically connect the bond pads 124, and the components in communication therewith, to the assembly substrate 110 and/or on or more of the other devices 120, and the components therein. Further, components within one device 120 can be in electric communications with components of other devices 120 (e.g., above and/or below the one device 120) via inter-device connections at the mating surfaces therebetween.

As shown in FIG. 1, the assembly 100 can include eight stacked devices 120. The stack of devices 120 can correspond with a first signaling channel of the assembly 100. A lowermost device 120 can couple to the assembly substrate 110 and be oriented with the raised portion 122 thereof facing a right side of the assembly 100. Six intermediary devices 120 can subsequently couple to the assembly 100 above the lowermost device 120. Each intermediary device 120 can be shingled (e.g., shifted to the left) from the preceding device 120. Further, the raised portion 122 of each intermediary device 120 can face the right side of the assembly 100 and be laterally adjacent to the raised portion 122 of the preceding device 120 (e.g., a right bottom corner of the intermediary device 120 can contact or be spaced from a left side of the raised portion 122 of the preceding device 120). An uppermost device 120 can be coupled to the assembly 100 above the intermediary devices 120. The uppermost device 120 can be shingled from a top intermediary device 120, with the raised portion 122 thereof facing the right side of the assembly 100 and adjacent to the raised portion of the top intermediary device 120. A top surface of the raised portion 122 of each stacked device 120 (except the uppermost device 120) can extend above the bottom surface of the device 120 directly above. The devices 120 can be coupled to substrate 110 or a preceding device 120 (e.g., a device 120 just below/thereunder) using any suitable method, such as solder bonding, hybrid bonding, surface bonding, or any similar suitable bonding method.

Although each device 120 as illustrated includes one bond pad 124, one or more of the devices 120 can include additional bond pads 124 on the raised portions 122 thereof. Further, the assembly 100 can include additional wire segments 130 coupled to the substrate 110 and to one or more of the bond pads 124 and/or additional bond pads. Similarly, although the devices 120 as illustrated include the raised portion 122 along the right edge (e.g., a first edge) on the periphery of the devices 120, in some embodiments, one or more of the devices can further include the raised portion 122 (and the bond pad(s) 124 thereon) on a second, third, and/or fourth edge on the periphery of the devices 120. For example, the device 120 can include the raised portion 122 on the first edge (e.g., as illustrated in FIG. 1) and a second edge extending from a shared corner with the first edge (e.g., parallel with the view-plane of FIG. 1) and forming a chevron shape. Devices 120 with chevron-shaped raised portions 122 can be stacked and shingled diagonally (e.g., along a bisecting line of the chevron). As further examples, the device 120 can include the raised portion 122 (i) on the first edge and a second edge parallel to the first edge, (ii) on three edges, or (iii) on all four edges. In these further examples, stacked devices 120 can be tiered such that a width and/or length of subsequently stacked device 120 fits within the raised portion 122 of the preceding device 120 (e.g., higher devices 120 can have shorter widths and/or lengths than lower devices 120).

In some embodiments, the assembly 100 can include additional stacks of devices 120. For example, the assembly 100 can include, in total, 2, 4, 8, or 16 (or any number greater than or therebetween) stacks of devices 120 coupled to the substrate 110 in a grid-like pattern. The additional stacks of devices 120 can similarly be oriented with the raised portions 122 of the devices 120 facing the right side of the assembly 100. One or more of the additional stacks of devices 120 can instead be oriented with the raised portions 122 of the devices 120 facing the left side, a back side (e.g., into the view-plane of FIG. 1), and/or a front side (e.g., out of the view-plane of FIG. 1) of the assembly 100. Further, portions of one or more additional stacks of devices 120 can vertically overlap other stacks of devices 120. For example, a portion of the uppermost and/or one or more intermediary devices 120 of one stack can vertically align with a portion of the lowermost and/or one or more intermediary devices 120 of another stack. Each of the additional stacks of devices 120 can correspond with a signaling channel of the assembly 100 (e.g., a second, third, and fourth signaling channel, etc.).

In some embodiments, the stack of devices 120 as illustrated in FIG. 1—or when the assembly 100 includes multiple stacks of devices 120 as discussed in the above example: one or more stacks of devices 120—can include less than eight devices 120 (e.g., 1, 2, 3, 4, 5, 6, or 7 devices 120). Conversely, in some embodiments, the stack of devices 120 as illustrated in FIG. 1, or one or more of the multiple stacks of devices 120, can include more than eight devices 120 (e.g., 12, 16, or 24, or any number greater than, less than, or therebetween). When a stack of devices 120 includes more than eight devices 120, devices 120 within the stack can correspond with one or more signaling channels. For example, if a stack of devices 120 has sixteen devices 120, a bottom eight devices 120 can correspond with a first channel and a top eight devices 120 can correspond with a second channel.

Figure 2:
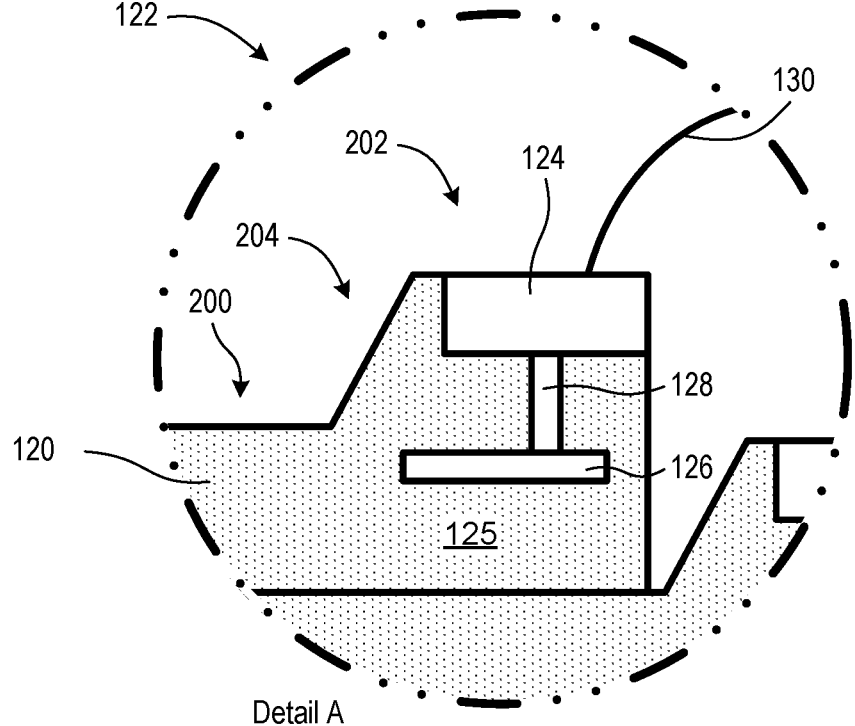
FIG. 2 is a detail view of Detail A from FIG. 1 showing a selected portion of a semiconductor device, configured in accordance with some embodiments of the present technology.

FIG. 2 is a detail view of Detail A from FIG. 1 showing the raised portion 122 of the uppermost device 120, configured in accordance with some embodiments of the present technology. Although only the raised portion 122 of the uppermost device 120 is shown in FIG. 2, the lowermost and intermediary devices 120 of FIG. 1 can include the same and/or similar features to those described with reference to the uppermost device 120. As illustrated in FIG. 2, the uppermost device 120 is coupled to the top intermediary device 120 (e.g., the preceding device 120) and includes the wire segment 130 coupled to the bond pad 124. The uppermost device 120 can include a substrate 125 with one or more components 126 (e.g., functional features) therein. The component 126 can be in electric communication with the bond pad 124 via a conductive structure 128. Although the uppermost device 120 as illustrated includes one component 126 and one conductive structure 128, the uppermost device 120 can include additional components 126 and/or additional conductive structures 128. One or more of the components 126 can be interconnected within the substrate 125, and one or more conductive structures 128 can electrically connect the one or more components 126 with the bond pad 124 (or one or more bond pads 124).

The uppermost device 120 can include a top surface having multiple regions and a bottom surface opposite the top surface. For example, the top surface can include a first region 200, a second region 202, and a third region 204. The first region 200 can be adjacent to the second region 202 with the third region 204 therebetween. The first region 200 can extend from the third region 204 to a left end of the uppermost device 120 (see FIG. 1), and can be defined by the substrate 125 and/or one or more components therein. The second region 202 can extend from the third region 204 to a right end of the uppermost device 120, and can be defined by the substrate 125, the bond pad 124, and/or the conductive structure 128. The first region can extend at least between 1 mm and 20 mm in width, inclusive; while the second region can extend at least between 50 μm and 600 μm in width, inclusive. Further, the lateral separation between the first and second regions (e.g., the width of the third region can be) can be as little as 0 μm (e.g., when the third region is vertical) or as large as 100 μm, inclusive, or greater. In some embodiments, the uppermost device 120 can include additional regions (e.g., a fourth region, a fifth region, etc.) between the first region 200 and the left end of the uppermost device 120.

As shown, the uppermost device 120 can have a first height (e.g., thickness, distance) between the bottom surface and the first region 200, and can have a second height between the bottom surface and the second region 202. The first height can at least be between 10 μm and 500 μm, inclusive; while the second height can at least be between 15 μm and 540 μm, inclusive, such that a difference between the first height and the second height can be 5 μm, 10 μm, 20 μm, or 40 μm (or any specific value outside or therebetween). In some embodiments, the difference between the first height and the second height can be greater than the first height.

For example, when an upper device 120 is bonded to the first region 200 of the top surface of a lower device 120 (e.g., directly below the upper device 120), the second region 202 of the top surface of the lower device 120 can be above the first region 200 of the top surface of the upper device 120. That is, the height of the upper device 120 at the second region 202 thereof can be greater than the sum of the upper and lower device 120 heights at the first region 200 thereof. At the second region 202, a top surface of the bond pad 124 can be level (e.g., aligned, coplanar) with, above, or below a top surface of the substrate 125. When the top surface of the bond pad 124 is above or below the top surface of the substrate 125, the height of the uppermost device 120 in the second region 202 at the bond pad 124 and/or the substrate 125 can be greater than the height of the first region 200.

The third region 204 of the top surface can extend from the first region 200 to the second region 202. The uppermost device 120 can have an increasing height along the third region 204 (e.g., from the first region 200 to the second region 202). In some embodiments, the increase in height can be linear, or the increase can be non-linear (e.g., the third region 204 can have a concave or convex shape). In some embodiments the third region 204 may be vertical (e.g., perpendicular to the first and/or second regions 200, 202).

The raised portion 122 can include (e.g., be defined by) portions of the upper most device 120 above a plane of the first region 200 and between the third region 204, the back side, the right side, and the front side of the uppermost device 120. The uppermost device 120 can include the bond pad 124, the substrate 125, and one or more conductive structures 128 within the raised portion 122. A bottom surface of the bond pad 124 can be within the raised portion 122 (e.g., above the plane of the first region), or the bottom surface can be outside the raised portion 122 (e.g., below the place of the first region). In some embodiments, the uppermost device 120 can exclude components 126 within the substrate 125 of the raised portion 122.

For example, the substrate 125 can exclude a top surface of any component 126 within the raised portion 122. Alternatively, in some embodiments, a portion (or all) of one or more components 126 can be positioned within the raised portion 122. Regardless of whether the uppermost device 120 includes a portion (or all) of one or more components 126 in the raised portion 122, the uppermost device 120 can include one or more components 126 under the first region 200. A top surface of the one or more components 126 under the first region 200 can be at or below the top surface of the uppermost device 120.

As used herein, RDL collectively refers to the bond pad(s) 124, the conductive structure(s) 128 coupled directly between the bond pad 124 and the components 126, and portions of the substrate 125 above the plane of the first region 200. In some embodiments, the RDL can be an inline RDL (e.g., iRDL). That is, for example, one or more of the devices 120, including the RDL, can be formed by a single facility (e.g., a fabrication operation), as opposed to forming one or more portions of the devices 120 at different facilities.

As one example, the uppermost device 120 (or any embodiment of the device 120) can include an RDL exclusively on an edge of the device 120, and can include the top surface with the second region 202 taller than the first region 200. Within the RDL, the device 120 can include the bond pad 124, portions of the substrate 125, and the conductive structure 128. The bottom surface of the bond pad 124 can be above the plane of the first region 200 and the RDL can exclude any portion of the component 126. The component 126 can include a portion under the first region 200 with the top surface of the component 126 proximate to the top surface of the device 120 (e.g., top surfaces separated by 1 μm, 2 μm, 3 μm, 4 μm, 5 μm, or any specific value outside or therebetween). In this example, a larger (e.g., taller) portion of the substrate 125 is between the top surface of the component 126 and the bottom surface of the bond pad 124 than is between the top surface of the component 126 and the top surface of the device 120 at the first region 200. That is, a buffer portion between the bond pad 124 and the component 126 is only at the RDL on a periphery of the uppermost device 120. Further, the buffer portion is excluded above the first region.

FIG. 3 is a flow diagram illustrating a process 300 for producing a semiconductor device assembly, in accordance with some embodiments of the present technology. For example, the process can be used to produce the assembly 100 of FIG. 1. The operations of process 300 are intended for illustrative purposes and are non-limiting. In some embodiments, for example, the process 300 can be accomplished with one or more additional operations not described, without one or more of the operations described, or with operations described and/or not described in an alternative order. As shown in FIG. 3, the process may include: (i) forming a plurality of semiconductor devices (process portion 302), forming including (a) forming a preliminary semiconductor device with a top surface and a bottom surface, the top surface having a first area adjacent to a second area (process portion 302(a)), and (b) forming a finalized semiconductor device, wherein each of the plurality of semiconductor devices is one of the finalized semiconductor devices and has a top surface with a first region at the first area and a second region above the second area (process portion 302 (b)); bonding the bottom surface of a first semiconductor device to a semiconductor device assembly substrate (process portion 304); and bonding the bottom surface of a second semiconductor device to the top surface of the first semiconductor device (process portion 306). In some embodiments, process portion 302 can be omitted and, instead, formed semiconductor devices can be provided (e.g., received) prepared for bonding (e.g., process portions 304 and/or 306).

Forming the plurality of semiconductor devices (process portion 302) can include (a) forming the preliminary semiconductor device (process portion 302(a)) and (b) forming the finalized semiconductor device (process portion 302(b)). Forming the preliminary semiconductor device can include forming a first portion of a preliminary semiconductor device substrate (e.g., the portion of the device 120 of FIG. 2 below the plane of the first region 200), including any components and/or interconnections therein. The first portion can include a top surface with a first area adjacent to a second area.

Forming a finalized semiconductor device can include forming a metallization layer over and extending from the first and the second areas; and forming an RDL over the second area of the preliminary semiconductor device, extending from the metallization layer, and exclusive of the first area (e.g., forming an iRDL, an RDL formed at a single facility/fabrication operation). The RDL can include a bond pad vertically spaced from the second area of the top surface of the preliminary semiconductor device. Further, the RDL can physically and/or electrically couple one or more conductive structures within the RDL to one or more of the components within the preliminary semiconductor device.

In some embodiments, forming a finalized semiconductor device can include forming a metallization layer over and extending from the first and the second areas at a first facility (e.g., a fabrication operation). Then, at a second facility, an RDL can be formed extending from the metallization layer and over the second area of the preliminary semiconductor device (e.g., a backend operation). In some embodiments, the finalized semiconductor device can exclude the metallization layer and the RDL can extend from the second area.

Each of the plurality of semiconductor dies is one of the finalized semiconductor dies and has a top surface with a first region at the first area of the preliminary semiconductor device, and a second region above the second area of the preliminary semiconductor device. A third region can extend between the first region and the second region. Forming and/or finalizing can utilize any suitable additive manufacturing process including, for example, sputtering, physical vapor deposition ("PVD"), electroplating, lithography, or any other similar process. Further, forming and/or finalizing can also include masking (e.g., dielectric, photoresist material) and/or etching processes intermixed with the additive processes.

Bonding the bottom surface of a first semiconductor device to a semiconductor device assembly substrate (process portion 304) can include preparing the semiconductor device assembly substrate and coupling the first semiconductor device (e.g., one of the plurality of formed semiconductor devices) to a surface (e.g., top, side, bottom, etc.) thereof. Coupling can include any suitable mechanical, or mechanical and electrical, coupling between the bottom surface of the first semiconductor device and the surface (e.g., top surface) of the semiconductor device assembly substrate. For example, coupling can include an adhesive, fusion bonding, solder bonding, or any other similar suitable process. After the first semiconductor device is bonded to the assembly substrate, a wire segment can be coupled between the bond pad at the edge RDL of the first semiconductor device and a bond pad of the assembly substrate. In some embodiments, one or more additional first semiconductor devices can be bonded to the assembly substrate.

Thereafter, bonding the bottom surface of a second semiconductor device to the top surface of the first semiconductor device (process portion 306) can include aligning and coupling the second semiconductor device (e.g., one of the plurality of formed semiconductor devices) to the first semiconductor device. Aligning can include placing the edge RDLs of the first and second semiconductor devices in parallel and laterally adjacent to one another, and placing one or both sides (e.g., sides perpendicular to the edge RDL, device front and/or back sides as detailed regarding FIG. 1) of the second semiconductor device coplanar with (or offset from) one or both sides of the first semiconductor device. Coupling can include any suitable mechanical, or mechanical and electrical, coupling between the bottom surface of the second semiconductor device and the top surface of the first semiconductor device, such as those described above. After the second semiconductor device is bonded to the first semiconductor device, a wire segment can be coupled between the bond pads at the edge RDL of the first and second semiconductor devices, and/or between the bond pad at the edge RDL of the second semiconductor device and the assembly substrate.

One or more additional semiconductor devices (e.g., 6) can further be coupled to the assembly by bonding each additional semiconductor device to the second semiconductor devices, or to a subsequent preceding device, forming a stack of devices (e.g., the stack of devices 120 from FIG. 1)

on the assembly substrate. A wire segment can be coupled between each additional semiconductor device and one or more of the preceding devices and/or the assembly substrate. In some embodiments, all wire segments can be coupled between semiconductor devices and/or between semiconductor devices and the assembly substrate after a stack of devices has been formed. For example, all devices can be stacked over the assembly substrate, then a wire segment can be coupled between the assembly substrate and the bond pads of the semiconductor devices.

In embodiments where the assembly includes one or more additional first semiconductor devices, one or more additional semiconductor devices can be stacked thereon. For example, two or more stacks of devices can be included in the assembly. After all stacks of semiconductor devices (e.g., one or stacks of devices) have been coupled to the assembly substrate and all wire segments formed therebetween, a mold material can be provided (e.g., encase) over and around the devices, and over and/or around the assembly substrate. Solder balls can be formed on a surface (e.g., bottom) of the assembly substrate opposite the semiconductor substrate for physically and electrically coupling the assembly with one or more additional assemblies, devices, and/or components.

Figure 4:
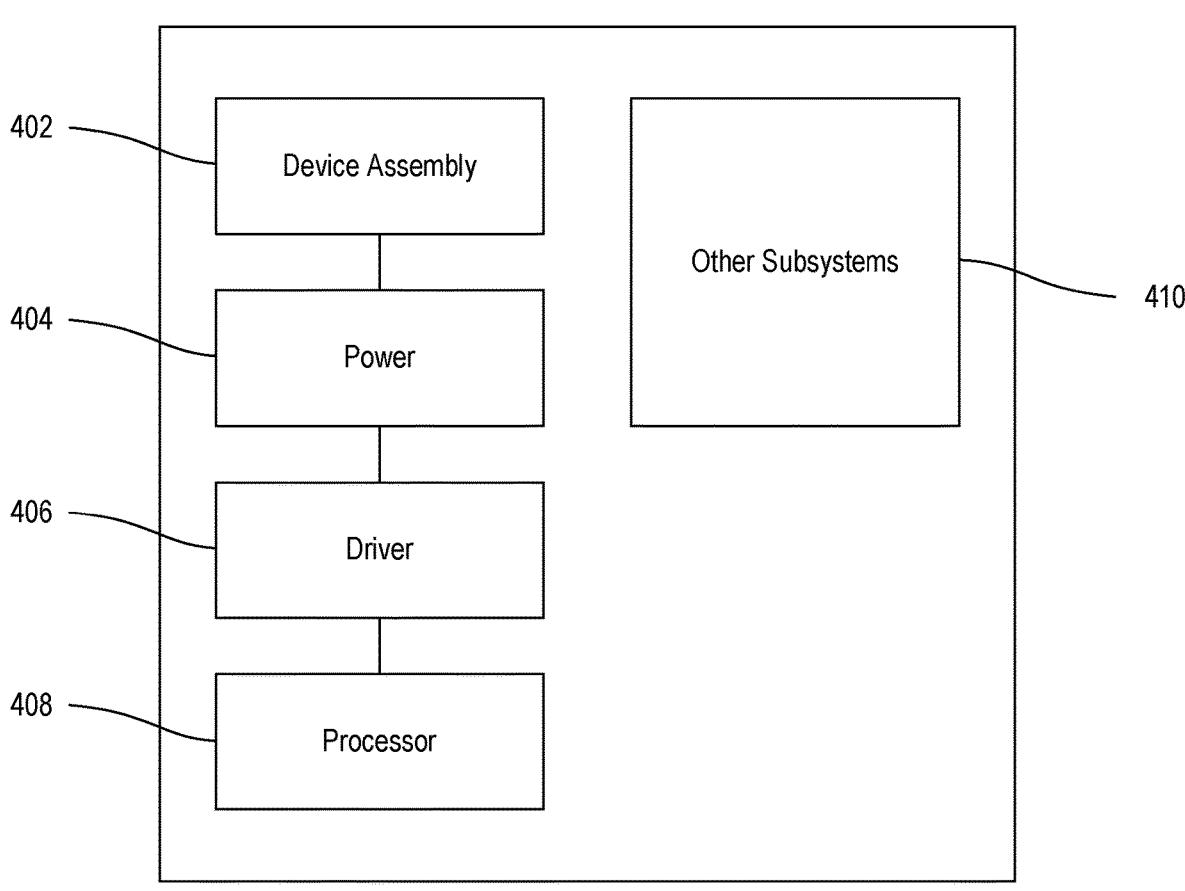
FIG. 4 is a schematic diagram illustrating a semiconductor device assembly incorporating the present technology, configured in accordance with some embodiments of the present technology.

Any one of the semiconductor devices and/or semiconductor device assemblies described above with reference to FIGS. 1-3 can be incorporated into any of a myriad of larger and/or more complex systems, a representative example of which is system 400 shown schematically in FIG. 4. The system 400 can include a semiconductor device assembly 402 (e.g., the assembly 100 of FIG. 1), a power source 404, a driver 406, a processor 408, and/or other subsystems or components 410. The semiconductor device assembly 402 can include features generally similar to those of the semiconductor devices and assemblies described above with reference to FIGS. 1-3. The resulting system 400 can perform any of a wide variety of functions, such as memory storage, data processing, or other suitable functions. Accordingly, representative systems 400 can include, without limitation, hand-held devices (e.g., mobile phones, tablets, digital readers, and digital audio players), computers, vehicles, appliances, and other products. Components of the system 400 may be housed in a single unit or distributed over multiple, interconnected units (e.g., through a communications network). The components of the system 400 can also include remote devices and any of a wide variety of computer readable media.

From the foregoing, it will be appreciated that specific embodiments of the technology have been described herein for purposes of illustration, but well-known structures and functions have not been shown or described in detail to avoid unnecessarily obscuring the description of the embodiments of the technology. To the extent any material incorporated herein by reference conflicts with the present disclosure, the present disclosure controls. Where the context permits, singular or plural terms may also include the plural or singular term, respectively. The terms "comprising," "including," "having," and "with" are used throughout to mean including at least the recited feature(s) such that any greater number of the same features and/or additional types of other features are not precluded. Similarly, use of the word "some" is defined to mean both "at least one" of the relevant features and/or elements.

As used herein, including in the claims, "and/or" as used in a list of items (e.g., a list of items prefaced by a phrase such as "at least one of" or "one or more of") indicates an inclusive list such that, for example, a list of at least one of A, B, and/or C means: A or B or C; or AB or AC or BC; or ABC (i.e., A and B and C). As used herein, the terms "vertical," "lateral," "upper," "lower," "above," and "below" can refer to relative directions or positions of features in the semiconductor devices in view of the orientation shown in the Figures. For example, "upper" or "uppermost" can refer to a feature positioned closer to the top of a page than another feature. These terms, however, should be construed broadly to include semiconductor devices having other orientations, such as inverted or inclined orientations where top/bottom, over/under, above/below, up/down, and left/right can be interchanged depending on the orientation. It should be noted that the methods described above describe possible implementations, and that the operations and the steps may be rearranged or otherwise modified and that other implementations are possible. Furthermore, embodiments from two or more of the methods may be combined.

From the foregoing, it will also be appreciated that various modifications may be made without deviating from the disclosure or the technology. For example, one of ordinary skill in the art will understand that various components of the technology can be further divided into subcomponents, or that various components and functions of the technology may be combined and integrated. In addition, certain aspects of the technology described in the context of particular embodiments may also be combined or eliminated in other embodiments. Although advantages associated with certain embodiments of the technology have been described in the context of those embodiments, other embodiments may also exhibit such advantages, and not all embodiments need necessarily exhibit such advantages to fall within the scope of the technology. Accordingly, the disclosure and associated technology can encompass other embodiments not expressly shown or described herein.

I claim:

1. A semiconductor device assembly, comprising:
an assembly substrate including a top surface; and
a die stack at the top surface including a first die and a second die, each of the first and the second dies having:
a die substrate having a planar bottom surface and a top surface;
a first region of the top surface a first distance from a first plane in which the planar bottom surface lies;
a second region of the top surface a second distance, greater than the first distance, from the first plane in which the planar bottom surface lies;
a bond pad at the second region of the top surface;
an active component formed in the die substrate beneath a second plane in which the first region of the top surface; and
a conductive structure extending from and directly electrically connecting the bond pad to the active component,
wherein the die substrate includes an RDL above a plane of the first region and below a plane of the second region, and wherein the RDL includes the bond pad and at least a portion of the conductive structure;
wherein the planar bottom surface of the first die is bonded to the top surface of the assembly substrate and the planar bottom surface of the second die is bonded to the first region of the top surface of the first die.

2. The semiconductor device assembly of claim 1 further comprising a third die and a fourth die, each of the third and fourth dies having:
a die substrate having a bottom surface and a top surface;
a first region of the top surface a first distance from the bottom surface;

a second region of the top surface a second distance, greater than the first distance, from the bottom surface; and a bond pad at the second region of the top surface;

wherein the bottom surface of the third die is bonded to the top surface of the assembly substrate spaced from the first die, and the bottom surface of the second die is bonded to the first region of the top surface of the first die.

3. The semiconductor device assembly of claim 1 further comprising a third die and a fourth die, wherein the bottom surface of the third die is bonded to the first region of the top surface of the second die, and wherein the bottom surface of the fourth die is bonded to the first region of the top surface of the third die.

4. The semiconductor device assembly of claim 1 further comprising a wire segment, wherein the wire segment is coupled between the bond pad of the first die, the bond pad of the second die, and the assembly substrate.

5. The semiconductor device assembly of claim 1, wherein the first die and the second die each include the second region of the top surface along a peripheral side edge of the first and the second die, respectively.

6. The semiconductor device assembly of claim 5, wherein the second region of the top surface of the first and the second dies are laterally adjacent.

7. The semiconductor device assembly of claim 1, wherein the first and the second dies are shingled relative to one another.

8. The semiconductor device assembly of claim 1, wherein the first and the second dies are encased in a mold material.

9. A semiconductor die, comprising:

a die substrate including a planar bottom surface and a top surface;

a first region of the top surface a first distance from a first plane in which the planar bottom surface lies;

a second region of the top surface, adjacent to the first region, a second distance greater than the first distance from the first plane in which the planar bottom surface lies;

a bond pad at the second region of the top surface;

an active component formed in the die substrate beneath a second plane in which the first region of the top surface; and a conductive structure extending from and directly electrically connecting the bond pad to the active component, wherein the die substrate includes an RDL above a plane of the first region and below a plane of the second region, and wherein the RDL includes the bond pad and at least a portion of the conductive structure.

10. The semiconductor die of claim 9 further comprising a third region between the first and the second regions, and extending from the first region to the second region.

11. The semiconductor die of claim 9, wherein the die substrate excludes any portion of an active component above a plane of the first region and below a plane of the second region.

12. The semiconductor die of claim 9, wherein the second region extends along a first side edge of the die substrate.

13. The semiconductor die of claim 12, wherein the second region further extends along a second side edge of the die substrate, the second side edge extending from a corner of the die substrate shared with the first side edge.

14. The semiconductor die of claim 9, wherein a difference between the first distance and the second distance is greater than 5 $\mu$m.

15. The semiconductor die of claim 9 further comprising a plurality of bond pads at the second region of the top surface.

16. The semiconductor die of claim 9, wherein a difference between the first distance and the second distance is greater than the first distance.

\* \* \* \* \*